US008574681B2

(12) United States Patent
Ruoff et al.

(10) Patent No.: US 8,574,681 B2
(45) Date of Patent: Nov. 5, 2013

(54) CERAMIC COMPOSITE THIN FILMS

(75) Inventors: Rodney S. Ruoff, Skokie, IL (US);
Sasha Stankovich, Spartanburg, SC (US); Dmitriy A. Dikin, Skokie, IL (US); SonBinh T. Nguyen, Evanston, IL (US)

(73) Assignee: Northwestern University, Evanston, IL (US)

( * ) Notice: Subject to any disclaimer, the term of this patent is extended or adjusted under 35 U.S.C. 154(b) by 712 days.

(21) Appl. No.: 12/152,284

(22) Filed: May 13, 2008

(65) Prior Publication Data
US 2010/0323178 A1    Dec. 23, 2010

Related U.S. Application Data

(60) Provisional application No. 60/930,102, filed on May 14, 2007.

(51) Int. Cl.
*B05D 3/02* (2006.01)

(52) U.S. Cl.
USPC .................................................. 427/376.2

(58) Field of Classification Search
USPC .................................................. 427/376.2
See application file for complete search history.

(56) References Cited

U.S. PATENT DOCUMENTS

| 5,446,339 | A * | 8/1995 | Kinoshita et al. ............. 313/478 |
| 2003/0187124 | A1* | 10/2003 | Hirata et al. .................... 524/496 |
| 2006/0102562 | A1 | 5/2006 | Cannon et al. ................. 210/681 |
| 2006/0202105 | A1 | 9/2006 | Krames et al. ............. 250/208.1 |
| 2007/0092432 | A1 | 4/2007 | Prud'Homme et al. ...... 423/448 |
| 2008/0048152 | A1* | 2/2008 | Jang et al. .................. 252/378 R |

OTHER PUBLICATIONS

Watcharotone et al "Graphene-based Silica Composite Thin Films", 2007 APS March Meeting Mar. 8, 2007.*
Nicholas A. Kotov, et al., Ultrathin Graphite Oxide-Polyelectrolyte Composites Prepared by Self-Assembly: Transition Between Conductive and Non-Conductive States, Advanced Materials, 1996, 8, No. 8, pp. 637-641.
Kuanping Gong, et al., Sol-Gel-Derived Ceramic—Carbon Nanotube Nanocomposite Electrodes: Tunable Electrode Demension and Potential Electrochemical Applications, Analytical Chemistry, 2004, 76, pp. 6500-6505.
Michael W. Rowell, et al., Organic solar cells with carbon nanotube network electrodes, Applied Physics Letters, 2006, 88, pp. 233506(1-3).

(Continued)

*Primary Examiner* — Nathan Empie
(74) *Attorney, Agent, or Firm* — Klintworth & Rozenblat IP LLC

(57) ABSTRACT

A ceramic composite thin film or layer includes individual graphene oxide and/or electrically conductive graphene sheets dispersed in a ceramic (e.g. silica) matrix. The thin film or layer can be electrically conductive film or layer depending the amount of graphene sheets present. The composite films or layers are transparent, chemically inert and compatible with both glass and hydrophilic SiOx/silicon substrates. The composite film or layer can be produced by making a suspension of graphene oxide sheet fragments, introducing a silica-precursor or silica to the suspension to form a sol, depositing the sol on a substrate as thin film or layer, at least partially reducing the graphene oxide sheets to conductive graphene sheets, and thermally consolidating the thin film or layer to form a silica matrix in which the graphene oxide and/or graphene sheets are dispersed.

10 Claims, 4 Drawing Sheets

(56) References Cited

OTHER PUBLICATIONS

Pinggui Liu, et al., Synthesis of polyaniline-intercalated graphite oxide by an in situ oxidative polymerization reaction, Carbon, 1999, 37, pp. 701-711.
Sasha Stankovich, et al., Synthesis and exfoliation of isocyanate-treated graphene oxide nanoplatelets, Carbon, 2006, pp. 3342-3347.
Nina I. Kovtyukhova, et al., Layer-by-Layer Assembly of Ultrathin Composite Films from Micron-Sized Graphite Oxide Sheets and Polycations, Chem. Mater., 1999, 11, pp. 771-778.
O. Lev, et al., Sol-Gel Materials in Electrochemistry, Chem. Mater., 1997, 9, pp. 2354-2375.
Hany Aziz, et al., Degradation Phenomena in Small-Molecule Organic Light-Emitting Devices, Chem. Mater., 2004, 16, pp. 4522-4532.
Virginie Roméas, et al., Testing the Efficacy and the Potential Effect on Indoor Air Quality of a Transparent Self-Cleaning $TiO_2$-Coated Glass through the Degredation of a Fluoranthene Layer, Ind. Eng. Chem. Res., 1999, 38, pp. 3878-3885.
G. Evmenenko, et al., Specular x-ray reflectivity study of ordering in self-assembled organic and hybrid organic-inorganic electro-optic multilayer films, J. Chem. Phys., 2001, 115, pp. 6722-6727.
Toshiro Maryama and Kenji Tabata, Indium-Tin Oxide Thin Films Prepared by Chemical Vapor Deposition from Metal Acetates, Japanese Journal of Applied Physics, 1990, vol. 29, No. 2, pp. L 355-L 357.
Sasha Stankovich, et al., Stable aqueous dispersions of graphitic nanoplatelets via the reduction of exfoliated graphite oxide in the presence of poly(sodium 4-styrenesulfonate), Journal of Materials Chemistry, 2006, 16, pp. 155-158.
D. Shimono, et al., Preparation of transparent and conductive ZnO films using a chemical solution deposition process, Journal of Ceramic Processing Research, 2001, vol. 2. pp. 184-188.
J.F. Chang, et al., Studying of transparent conductive ZnO: Al thin films by RF reactive magnetron sputtering, Journal of Crystal Growth, 2000, 211, pp. 93-97.
Changshu Xiang, et al., Electrical properties of multiwalled carbon nanotube reinforced fused silica composites, Journal of Nanoscience and Nanotechnology, 2006, 6(12), pp. 3835-3841.
Toshi Tsuchiya, et al., Preparation and properties of transparent conductive thin films by the sol-gel process, Journal of Non-Crystalline Solids, 1994, 178, pp. 327-332.
Masashi Ohyama, et al., Sol-Gel Preparation of Transparent and Conductive Aluminum-Doped Zinc Oxide Films with Highly Preferential Crystal Orientation, J. Am. Ceram. Soc., 1998, 81(6), pp. 1622-1632.
William S. Hummers, Jr. and Richard E. Offeman, Preparation of Graphitic Oxide, Journal of the American Chemical Society, 1958, 80, p. 1339.
Changshu Xiang, et al., Fabrication and dielectric properties of CNTs/SiO2 composites, Key Engineering Materials, 2005, pp. 280-283. Abstract.
Thierry Cassagneau, et al., Preparation and Characterization of Ultrathin Films Layer-by-Layer Self-Assembled from Graphite Oxide Nanolatelets and Polymers, Langmuir, 2000, 16, pp. 7318-7324.
Athanasios B. Bourlinos, et al., Graphite Oxide: Chemical Reduction to Graphite and Surface Modification with Primary Aliphatic Amines and Amino Acids, Langmuir, 2003, 19, pp. 6050-6055.
E. Terzini, et al., Properties of ITO thin films deposited by RF magnetron sputtering at elevated substrate temperature, Materials Science & Engineering, B Solid-State Materials for Avanced Technolgy, 2000, pp. 110-114.
Sasha Stankovich, et al., Graphene-based composite materials, Nature, 2006, vol. 442, pp. 282-286.
J. Zhang, et al., Sol-gel preparation of poly(ethylene glycol) doped indium tin oxide thin films for sensing applications, Optical Materials, 2004, 26(1), pp. 47-55.
Joseph G. Smith, Jr., et al., Carbon nanotube-conductive additive-space durable polymer nanocomposite films for electrostatic charge dissipation, Polymer, 2004, 45, pp. 6133-6142.
Kent A. Watson, et al., Transparent, flexible, conductive carbon nanotube coatings for electrostatic charge mitigation, Polymer, 2005, 46, pp. 2076-2085.
S.M. Rozati and T. Ganj, Transparent conductive Sn-doped indium oxide thin films deposited by spray pyrolysis technique, Renewable Energy, 2004, 29, pp. 1671-1676.
Kunjal Parikh, et al., Flexible vapour sensors using single walled carbon nanotubes, Sensors and Actuators, B Chemical, 2006, 113, pp. 55-63.
Qiang Wei, et al., Direct patterning ITO transparent conductive coatings, Solar Energy Materials & Solar Cells, 2001, 68, pp. 383-390.
Yong Gan, et al., Transparent conductive indium tin oxide film fabricated by dip-coating technique from colloid precursor, Surface & Coatings Technology, 2006, 201, pp. 25-29.
Seon-Soon Kim, et al., Transparent conductive ITO thin films through the sol-gel process using metal salts, Thin Solid Films, 1999, 347, pp. 155-160.
C. Beneking, et al., Recent developments of silicon thin film solar cells on glass substrates, Thin Solid Films, 1999, 351, pp. 241-246.
Kunisuke Maki, et al., Fabrication of thin films of ITO by aerosol CVD, Thin Solid Films, 2003, 445, pp. 224-228.
Suzhu Yu, et al., Effect of processing temperature on the properties of sol-gel-derived mesoporous silica films, Thin Solid Films, 2004, 462-463, pp. 306-310.
J.J. Finley, Heat treatment and bending of low-E glass, Thin Solid Films, 1999, 351, pp. 264-273.

\* cited by examiner

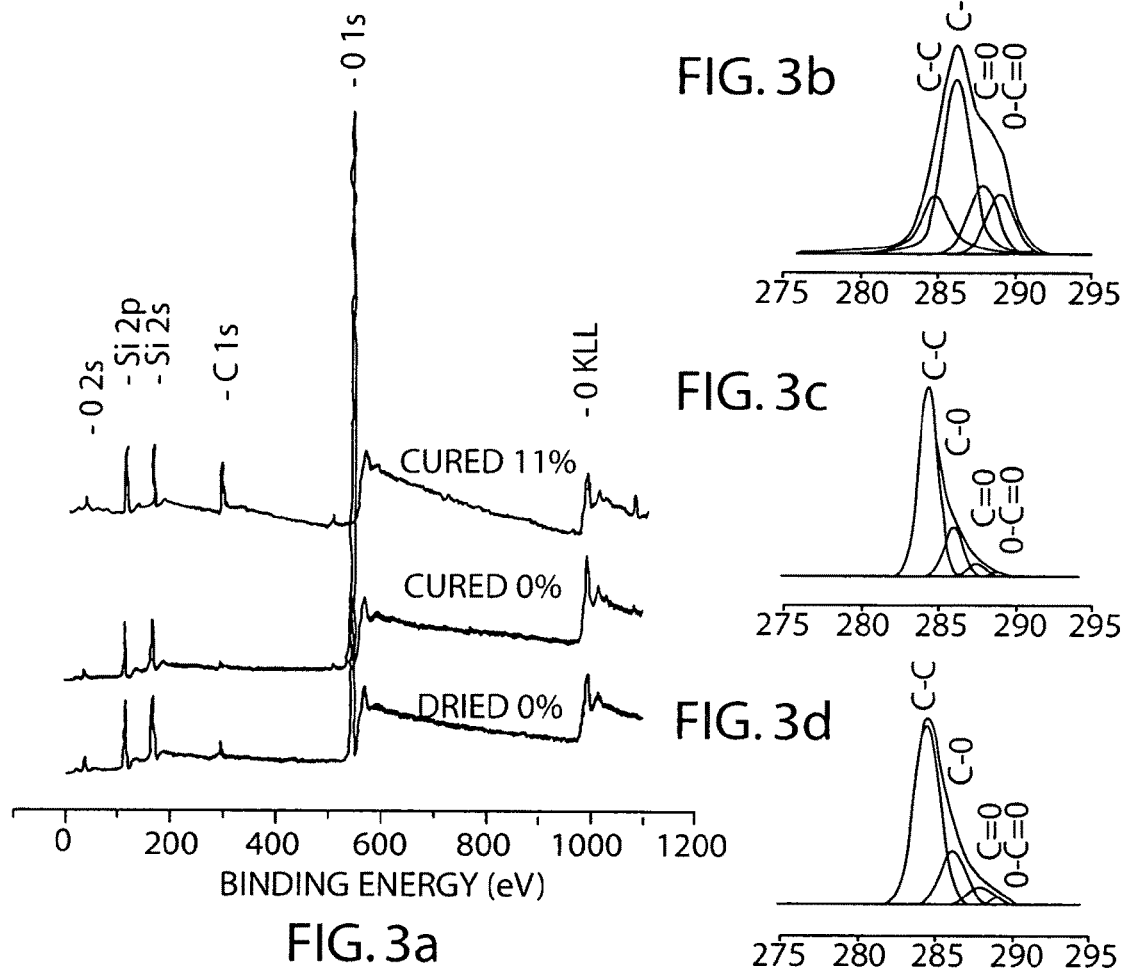
FIG. 3b
FIG. 3c
FIG. 3a
FIG. 3d
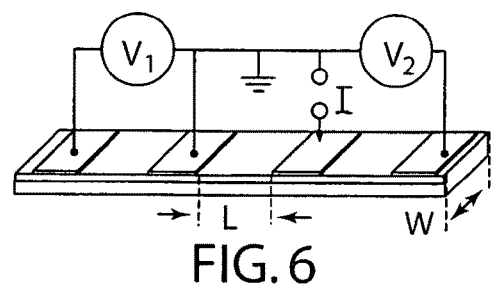
FIG. 6

CERAMIC COMPOSITE THIN FILMS

RELATED APPLICATIONS

This application claims priority and benefits of U.S. provisional application Ser. No. 60/930,102 filed May 14, 2007, the disclosure of which is incorporated herein by reference.

CONTRACTUAL ORIGIN OF THE INVENTION

The invention was made with government support under Grant No. NCC-1 02037 awarded by NASA. The Government has certain rights in the invention.

FIELD OF THE INVENTION

The present invention relates to macroscale ceramic composite thin films and, in particular, to silica-based composite thin films containing a plurality of individual graphene oxide and/or conductive graphene sheets that can render the transparent films electrically conductive.

BACKGROUND OF THE INVENTION

Electrically conductive glass is used in a broad range of applications such as in solar reflecting windshield, and self-cleaning windows, electrostatic charge-dissipating coatings, solar cells, and sensor devices. Typically, to render glass conductive, glass is coated with metal oxide films such as indium tin oxide (ITO) or aluminum-doped zinc oxide (AZO). However, the conventional fabrication processes for coating ITO (or AZO) on glass, such as magnetron sputtering deposition, chemical vapor deposition or spray pyrolysis are expensive and complex. In addition, these coatings are susceptible to ion diffusion from the metal oxide films into the substrates, which can be unfavorable for long-tern device performance. As such, much research has been devoted to find a simple solution-based route to fabricate highly stable electrically conductive thin films.

SUMMARY OF THE INVENTION

The present invention provides a composite film or layer comprising a ceramic matrix and individual sheets dispersed in the matrix and comprising graphene oxide sheets and/or electrically conductive graphene sheets obtained by in-situ reduction of the graphene oxide sheets in the matrix. The composite thin film or layer can be electrically conductive depending upon the amount of graphene sheets present in the composite. The composite films or layers are substantially transparent, chemically inert and compatible with both glass and hydrophilic SiOx/silicon substrates. In addition, because their conductivities do not depend on ions, the films or layers should not be susceptible to loss of performance due to ion diffusion.

The present invention provides a sol-gel method of making a composite film or layer by making a suspension comprising graphene oxide sheets, introducing a silica-precursor or silica to the suspension to form a sol of individual graphene oxide sheets and silica particles, depositing the suspension on a substrate as thin film or layer, at least partially reducing in-situ the graphene oxide sheets to conductive graphene sheets, and thermally consolidating the thin film or layer to form a silica matrix in which individual graphene oxide sheets and/or graphene sheets are dispersed.

Other features and advantages of the present invention will become more readily apparent from the following detailed description taken with the following drawings.

DESCRIPTION OF THE DRAWINGS

FIG. 3a is XPS survey of a pure silica (0 weight % graphene oxide) film dried at 100 degrees C. and cured at 400° C. and a composite containing 11 weight % graphene oxide after being cured at 400° C. FIGS. 3b, 3c and 3d are C 1s XPS spectra of the 11 weight % composite film after drying (FIG. 3b), after chemical reduction (FIG. 3c), and after both chemical reduction and high temperature curing (FIG. 3d).

FIG. 6 is a schematic view of a four-probe configuration for electrical conductivity measurements.

DESCRIPTION OF THE INVENTION

Figure 1A:
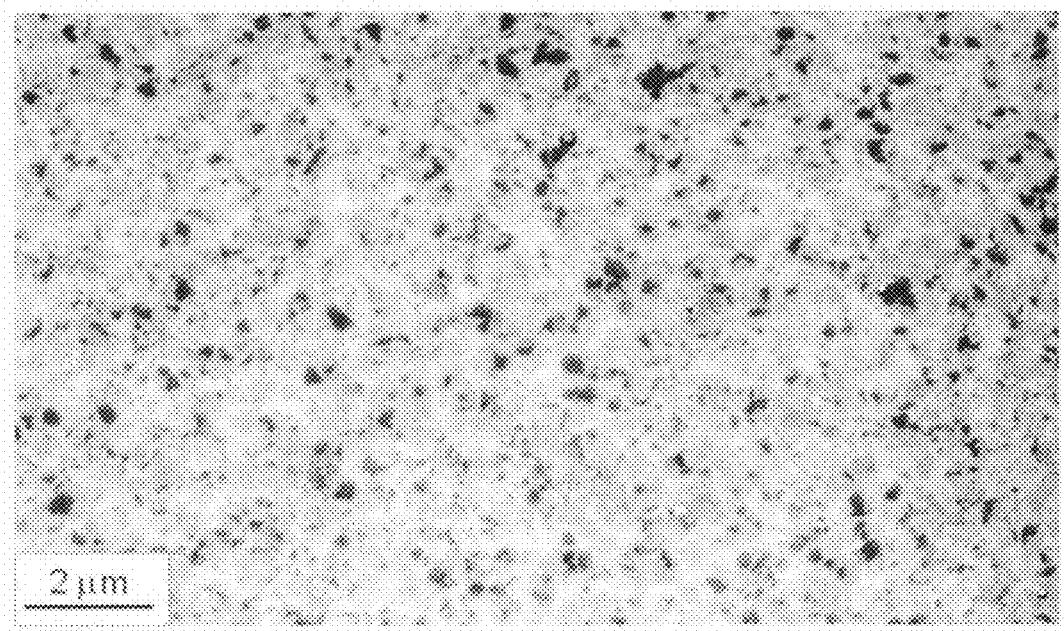
FIGS. 1a, 1b, and 1c are SEM images of 6.6 weight % graphene oxide-silica composite films pursuant to an embodiment of the invention.

An embodiment of the present invention envisions a composite film or layer comprising a ceramic (e.g. silica or other ceramic) matrix and a plurality of individual graphene oxide sheets and/or electrically conductive graphene sheets dispersed in the matrix. The composite thin film or layer can be electrically conductive depending upon the amount of graphene sheets present in the composite. The graphene oxide sheets and/or graphene sheets are uniformly distributed throughout the matrix. For purposes of illustration and not limitation, a composite film or layer before and after thermal treatment pursuant to the invention is shown in FIGS. 2b and 2c, respectively, and show a silica matrix having individual graphene oxide and/or conductive graphene sheets dispersed in the matrix. The sheets are generally aligned in the plane of the film or layer with overlapping of some of the sheets.

The ceramic composite film or layer can be fabricated in a method embodiment of the invention using a simple sol-gel route and has excellent potential as an electrically conducting and transparent material for a variety of uses. The ceramic matrix material can comprise silica or other ceramic such as alumina or any ceramic that is amenable to fabrication as a thin film using the sol-gel method. The composite film or layer as fabricated and thermally treated can be very thin (e.g. 10-50 nm thickness) and smooth (e.g. 5-15 Angstroms surface roughness) depending on the amount of individual graphene oxide sheets and/or graphene sheets distributed throughout the film or layer as described below. The performance of the composite thin film or layer may be improved with higher loading of graphene-based sheets or with chemical modifications of the graphene oxide filler sheets. Not only is the fabrication method effective for incorporation of individual graphene-based sheets into the silica matrix, but also the method can potentially be used to modify virtually any hydrophilic substrate surface. In addition to potential applications of the ceramic-graphene composite film or layer as a conducting and transparent film or layer, the ability to coat electrically insulating glass/ceramic substrates with a very thin but electrically conductive silica-based composite film or layer may find many other uses as well.

A particular illustrative sol-gel method of fabricating a silica-based composite thin film or layer pursuant to an illustrative embodiment the invention involves exfoliating graphite oxide (GO) sheets in a water/ethanol mixture using an ultrasonic treatment to produce a stable suspension of the individual graphene oxide sheets. These exfoliated GO sheet fragments can be incorporated into inorganic matrices, such as silica, which involve aqueous or semiaqueous processing, such as those produced by the sol-gel route via hydrolysis and polycondensation of a metal alkoxide. In an illustrative embodiment of the invention, the well-known hydrolysis of tetramethyl orthosilicate (TMOS) is employed to form a sol comprising graphene oxide sheets and silica particles. In particular, the addition of TMOS into the above suspension yielded graphene oxide-containing sol that can be stored at room temperature for several days (weeks for the sols with high weight percentage of graphene oxide sheets such as 11 weight %).

Thin composite films then are prepared from the sol by spin-coating or other deposition technique onto borosilicate glass substrate, hydrophilic SiOx/silicon substrate, or any other suitable substrate. Solvent (ethanol) evaporation leads to quick gelation of the film or layer. For purposes of illustration and not limitation, graphene oxide sheets can be present from about 5 to about 15 weight % of the composite film before high temperature curing. The resulting composite film or layer is rendered electrically conductive by exposure for a time to an atmosphere that has been saturated with vapor of hydrazine monohydrate or other reducing agent, which will in-situ chemically reduce (chemically de-oxygenate) at least some, preferably most, of the graphene oxide sheets into electrically conductive graphene sheets. The treated film or layer then is dried at a temperature (e.g. at 100° C. for 3 hours) to convert the film or layer into a solid material. Finally, the film or layer is thermally treated (e.g. at 400° C. in an inert atmosphere) to form consolidated silica matrix having the individual graphene oxide sheets or graphene sheets disersed uniformly therein. Further details of this fabricating method are set forth in the EXAMPLE below.

The following EXAMPLE is offered to further illustrate the present invention but not limit the present invention.

EXAMPLE

Graphite oxide (GO) was prepared using the well-known Hummers method described by Hummers, W. S.; Offeman, R. E. in J. Am. Chem. Soc. 1958,80,1339-1339, the disclosure of which is incorporated herein by reference. This method typcially involves preparing bulk graphite oxide using SP-1 bulk graphite (30 μm, Bay Carbon, Bay City, Mich.). In particular, the SP-1 graphite is subjected to an oxidative treatment with potassium permanganate in concentrated sulfuric acid. For example, two (2) grams graphite were placed into a round bottom flask. Concentrated sulfuric acid (46 mL) was added and the mixture cooled in an ice bath. Potassium permanganate was added to the ice cooled mixture in small portions over 30 minutes. Following this addition, the reaction mixture was stirred at 35 degrees C. for 2 hours. After the two hours period, water (92 mL) was added to the reaction mixture and stirring continued for 15 minutes. Finally, the reaction mixture was poured into 270 mL of water and excess of potassium permanganate was neutralized by adding sufficient amount of water solution (30%) of hydrogen peroxide. Graphite oxide was recovered by filtration and washed with an HCl solution (10:1 water: concentrated HCl) until sulfates are no longer detected by a barium chloride test. The graphite oxide then was dried under vacuum (30 mTorr) for 24 hours.

Preparation of composite films was as follows: Dried GO (100 mg) was exfoliated in de-ionized water (20 mL) with ultrasonic treatment (about 30 min using a Fisher Scientific FS60 ultrasonic bath cleaner, 150 W) to form a colloidal suspension (5 mg/mL) of graphene oxide sheets. Sols were prepared by adding TMOS (0.1 mL) to a 5 mL vial containing a mixture of ethanol (1 mL) and a given amount of colloidal suspension of GO in water (0.00-0.97 mL to obtain approx. 0 to 11 weight % of GO in the composite films). Additional water was added to maintain a constant volume ratio of the components $(H_2O:C_2H_5OH:Si(OCH_3)_4=1.0:1.0:0.10)$. The vials were capped and the resulting sols were left at room temperature for a day before being used for the film fabrication. The TMOS was $Si(OCH_3)_4$ 99+% from Sigma-Aldrich, and ethanol was 100% from Aaper Alcohol), acetone was 99.9% min from VWR International.

Borosilicate glass cover slips were cleaned by ultrasonic treatment (Crest model 175HT, 50 W) first in acetone (15 minutes) and then in 1-propanol (5 minutes-99.5% from J. T. Baker). After drying with a nitrogen flow (Industrial Compressed Nitrogen, Airgas, Inc.), the glass cover slips were treated with oxygen plasma for 3 minutes (Plasma-Preen 11-862, Plasmatic System; 2 Torr oxygen, 350 W) to render them hydrophilic. Borosilicate glass cover slips $(18 \times 18 \times 0.18 \pm 0.02$ mm$^3$, VWR micro cover glass) used as substrates were purchased from VWR International.

Thin films were then deposited on the cleaned cover slips by spin-coating a few drops of the sols at 6000 rpm for 2 minutes using a WS-400-6NPP-LITE spin coater from Laurell Technologies Corporation. A chamber containing an atmosphere of hydrazine hydrate was prepared by putting a piece of filter paper (15 min×45 min) that have been thoroughly wetted with hydrazine hydrate (approx. 20 drops) into a 10-cm covered petri dish. The hydrazine hydrate was from Fisher Scientific used as-received.

Graphene oxide sheets in the composite films were reduced by exposing the films to this atmosphere overnight. Typically, the graphene oxide sheets are partially reduced to graphene sheets. The films were then dried at 100° C. for 3 hours in an air oven (Vulcan 3-550 oven from NDI), followed by curing at 400° C. for 3 hours under a controlled nitrogen gas flow (Sierra Instruments flow controller) in a tube furnace (Lindberg/Blue M, 2° C./min heating and 5° C./min cooling rates, respectively). This thermal treatment also faciliates additional reduction of graphene oxide sheets toward their graphitic form.

Figure 1B:
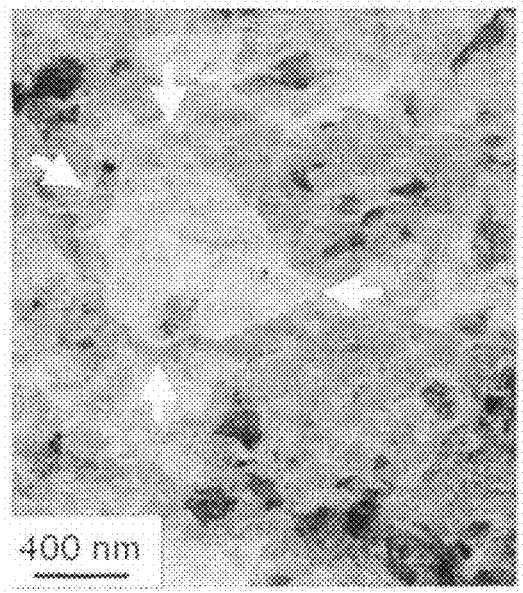
Figure 1C:
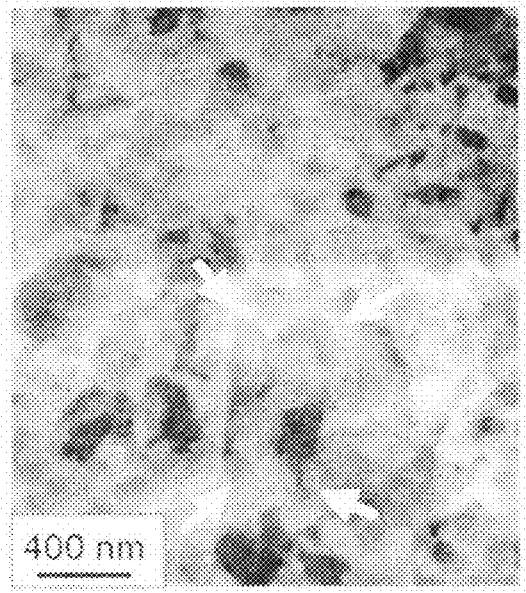

FIGS. 1(a), 1(b), and 1(c) are SEM images of 6.6 weight % graphene oxide-silica composite film at low magnification before heat curing treatment (FIG. 1(a)) and at high magnification before heat curing treatment (FIG. 1b) and at high magnification after heat curing treatment (FIG. 1c) as described in the EXAMPLE. The white arrows point to edges graphene oxide sheets in FIGS. 1(b) and 1(c). FIG. 1(c) shows some overlapping graphene sheets. The composite film or layer comprises a silica matrix and individual graphene sheets dispersed in the matrix and generally aligned in the plane of the film or layer with overlapping of some graphene sheets.

The SEM (scanning electron micrograph) images were acquired on two field emission SEM: using a Nova NanoSEM 600 (FEI Co.) and LEO 1525 (Carl Zeiss SMT AG). The accelerating voltage was varied between 1-10 keV incident beam energy, depending on the imaging mode and sample properties.

Figure 2A:
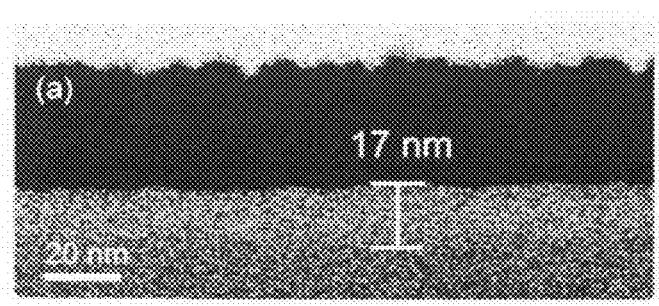
FIGS. 2a, 2b, and 2c are TEM images of a sol-gel derived composite films with 0 weight % graphene oxide sheets (FIG. 2a), with 11 weight % graphene oxide sheets (FIG. 2b) before high temperature curing, and with 11 weight % graphene oxide sheets (FIG. 2b) after high temperature curing.
Figure 2B:
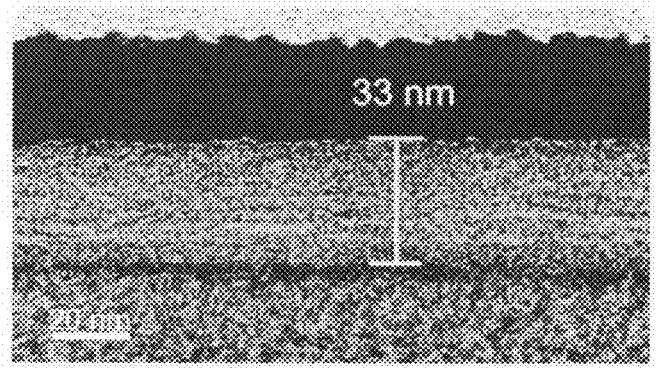
Figure 2C:
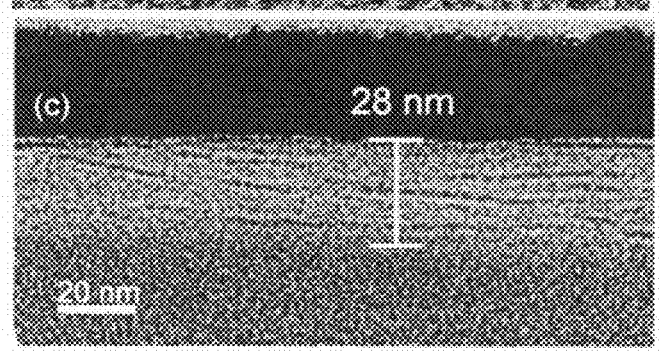
Figure 2D:
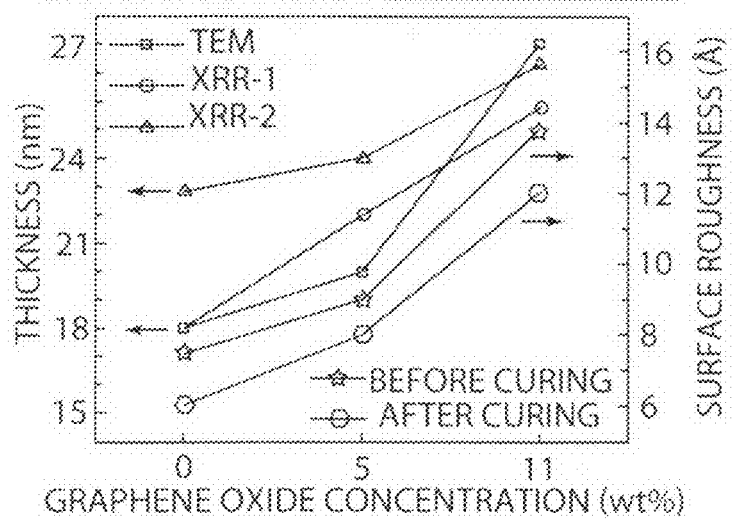
FIG. 2d is a plot of film thickness after high temperature curing obtained from both TEM and XRR and the surface roughness obtained from XRR before and after high temperature curing.

FIGS. 2(a), 2(b), and 2(c) are TEM images of the cross section of the sol-gel derived composite films with (a) 0 weight % graphene oxide sheets, (b) 11 wt % of graphene oxide sheets before the high temperature curing and (c) 11 weight % of graphene oxide sheets after the high temperature curing. In these figures, the layers shown are, from the bottom of each figure, the glass substrate, composite film, Pt layer, and a carbon layer. FIG. 2(d) illustrates plots of the film thickness of the same samples after high temperature curing obtained from both TEM (transmission electron microscopy) and XRR (X-ray reflectivity) and the surface roughness obtained from XRR before and after high temperature curing.

The TEM images were acquired on an JEOL 2100F instrument (JEOL Ltd., Japan) from samples prepared and also cut as needed by a SEIKO SMI-3050E focused ion beam (FIB) instrument (Seiko Instruments, Japan). To protect the composite films, Pt was first deposited onto their surfaces by sputter coating followed by deposition of a carbon layer by FIB decomposition of anthracene. The XRR studies were performed at Beam line X23B of the National Synchrotron Light Source (Brookhaven, N.Y.) using a Huber four-circle diffractometer in the specular reflection mode (i.e., incident angle B was equal to the exit angle). The experiments were performed at room temperature with 10.0-keV X-rays ($\lambda$=1.24 A), and the beam size of 0.4 mm vertically and 1.0 mm horizontally. The samples were kept under helium during the measurements to reduce the background scattering from ambient gas and radiation damage. The off-specular background was measured and subtracted from the specular counts. XRR measurements were also carried out using a Rigaku (The Woodlands, Tex.) ATX-G X-ray diffractometer (Cu-K$\alpha$ radiation, $\lambda$=1.544 A).

A scanning electron microscopy (SEM) image of a composite film containing 6.6 wt % of graphene oxide sheets after high temperature curing (FIG. 1a) indicates a homogeneous morphology with a random distribution of dissimilar black and white domains representing tiles of partially overlaping graphene oxide sheets. FIGS. 1(b) and 1(c) contrast high magnification SEM images of this same film before and after high temperature curing. In both images, slightly crumpled sheets overlapping each other can be readily observed, indicating a primarily in-plane orientation. Indeed, such planar distribution of the sheets throughout the film thickness is also evident in the transmission electron microscopy (TEM) images of the cross sections of the composite film with 11 wt % of graphene oxide sheets both before (FIG. 2b) and after curing (FIG. 2c). The lack of such features in the graphene oxide-free silica film (FIG. 2a) suggests that they originate from the embedded sheets.

The thickness of the composite films was determined by both TEM and X-ray reflectivity (XRR) measurements to be approx. 20-30 nm thickness, FIG. 2(a)-FIG. 2(c). The variation in film thickness determined by XRR fitting for different samples ranged from ±2 Å to ±5 Å. Under the conditions described in the EXAMPLE, the thickness of the films increased slightly with increasing graphene oxide concentration (FIG. 2d). The thickness of the films decreased after the high temperature curing step, indicating densification and consolidation of the matrix. While the film thickness obtained from TEM observation is confined to the cross section of a region smaller than 500 nm across (on a composite sample that is greater than 100 mm$^2$ in size), the XRR measurements are more representative of the average thickness, as the X-ray spot size is approx. 1×20 mm$^2$.

The average surface roughness of the films was quantified by both AFM in contact mode (approx. 10×10 $\mu$m$^2$ area) and XRR (approx. 1×20 mm$^2$ area). The average surface roughness of the films increases with increasing concentration of graphene oxide sheets but decreases after curing. For example, from XRR measurement, the sample with a nominal concentration of 11 wt % graphene oxide sheets had an average surface roughness of approx. 14 Å before and approx. 12 Å after curing, while for the 5 wt % sample the values were approx. 9 Å and approx. 8 Å, respectively (FIG. 2d). The surface roughness values given from AFM measurements are similar. The films are thus relatively smooth and geometrically uniform over both local regions (AFM) and the entire substrate (XRR). XRR data also indicate that the films are reasonably porous (estimated to be from 20-40% less dense than the borosilicate glass substrate, depending on humidity level) and this density does not change before and after high temperature curing. The density of these composite films remains the same (within the limits of measurement uncertainties) over the range of graphene oxide sheet concentrations employed (1-11 weight %). The AFM analysis involved acquiring AFM images taken on an AutoProbe CP/MT scanning probe microscope (MultiTask; Veeco Instruments). Imaging was performed in contact mode using a V-shaped 'Microlever' probe A (Park Scientific Instruments, Woodbury, N.Y., boron-doped Si tip with spring constant k=0.6 N/m with frequency $f_c$=78.6 kHz and nominal tip radius r=10 nm). The images were collected under ambient conditions at 23° C. and 50% relative humidity with a scanning rate of 1 Hz. The topology of the films with 3 weight % GO sheets before and after high temperature curing did not show the presence of the graphene-based sheets on the surface.

The chemical composition of both the matrix and the GO sheets was monitored by X-ray photoelectron spectroscopy (XPS) during each of the preparation steps. The high temperature curing step results in a significant decrease in the carbon content as seen in the survey XPS spectra of the dried and cured pure silica film of FIG. 3(a), indicating essentially complete hydrolysis of TMOS. The cured film with 11 weight % graphene oxide sheets exhibited a significantly higher carbon signal compared to that observed for the graphene oxide-free film, indicating the presence of the graphene-based filler sheets, FIG. 3(a). Specifically, the C is XPS spectrum of the composite film with 11 wt % graphene oxide before reduction and high temperature curing (FIG. 3b) is quite similar to that of graphite oxide itself. This region can be de-convoluted into four components corresponding to carbon atoms in different oxygen-containing functional groups: (a) the non-oxygenated C at 284.8 eV, (b) the carbon in C—O at 286.2 eV, (c) the carbonyl carbon (C=O, 287.9 eV), and (d) the carboxylate carbon (O—C=O, 289.0 eV). The C is XPS spectra of the hydrazine-treated film shows the presence of the same functionalities (see FIGS. 3b and 3c) but with much smaller contribution of the oxygenated carbons (27.6% vs. 81.8%), indicating that de-oxygenation has occurred. In addition, a small amount of incorporated nitrogen may be present as a consequence of exposure to hydrazine.

Figure 4:
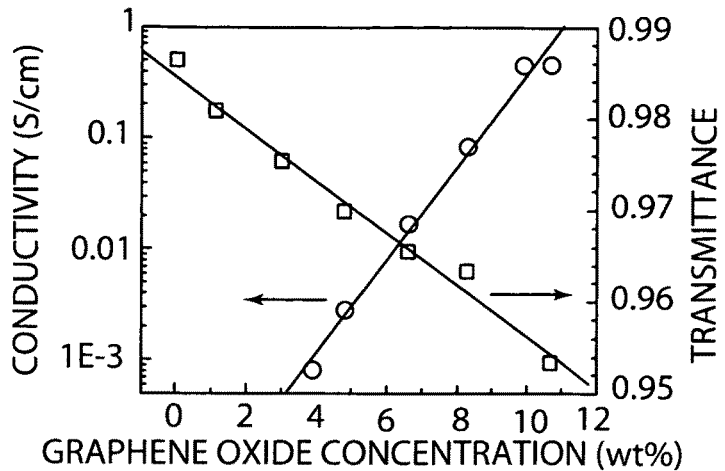
FIG. 4 is a plot of bulk electrical conductivity (circles) and light transmittance at 650 nm (squares) of graphene oxide-silica thin films as a function of graphene oxide concentration.

The highest levels of DC electrical conductivity were measured in the composite films that were both chemically reduced and thermally cured, with the magnitude of electrical conductivity increasing with the loading of the graphene oxide. The lowest measured conductivity (resistance less than 1 G$\Omega$ for equipment used) could be observed at loadings as low as 3.9 wt % of graphene oxide sheets. As a control, pure silica films that were exposed to hydrazine and cured showed no conductivity. The conductivity of the composite films changes by almost three orders of magnitude, from $(8.0\pm0.9)\times10^{-4}$ S/cm to $0.45\pm0.06$ S/cm, as the loading of graphene oxide increases from 3.9 wt % to 11 wt % (FIG. 4). The chemical reduction step appears to be essential for converting insulating graphene oxide sheets into conductive graphene-like sheets and inducing electrical conductivity in composite samples; e.g. the composite films that were subjected to high temperature curing without chemical reduction were simply non-conductive.

Chemical reduction alone renders the uncured hydrazine-treated composite films sufficiently conductive to be measured with the testing system described below, but only at higher loading levels of the graphene oxide filler $((1.1\pm0.1)\times10^{-3}$ S/cm at 11 wt % to $(7.0\pm0.7)\times10^{-5}$ S/cm at 9.1 wt %). The combination of chemical reduction and high-temperature treatment significantly improved the overall conductivity of the samples. Presumably, the consolidation of the composite film upon high temperature curing increases the density of the graphene-based sheets inside the silica matrix, reducing the average inter-sheet distances (change of film thickness) and resulting in more pathways for electrical conduction.

The electrical conductivity of the composite films was measured under ambient laboratory conditions using a standard four-probe testing system/method. A Keithley 6221 AC/DC current source and two Keithley 6514 electrometers (Keithley Instruments, Cleveland, Ohio) were connected to the sample using the configuration shown in FIG. 6. Four electrode contacts with an inter-electrode spacing of 0.5 mm were formed onto a cut sample by a thermally evaporating an approx. 20-nm-thick layer of gold (using BOC Edwards Auto 306 Evaporation System) onto a 3 to 5-mm-wide sample strip.

By the four-probe method, the intrinsic resistance (R) of the composite films could be expressed as:

$$R = \frac{V_2 - V_1}{I},$$

where $V_1$ and $V_2$ are voltages measured across the electrodes shown in FIG. 4a. The surface resistivity ($\rho_s$) is defined as:

$$\rho_s = R(w/L),$$

where w and L are the width and length of the sample area between two adjacent electrodes (FIG. 4a). The bulk conductivity (v) can be calculated as follows:

$$\sigma = \frac{1}{\rho_s t},$$

where t is the film thickness.

The uncured hydrazine-treated composite films are sufficiently electrically conductive to be measured with this testing system but only at higher loading levels of the graphene oxide filler. The bulk conductivity varies from $1.1\times10^{-3}$ S/cm at 11 wt % to $7.0\times10^{-5}$ S/cm at 9.1 wt % graphene oxide sheets as shown in FIG. 4.

Figure 5A:
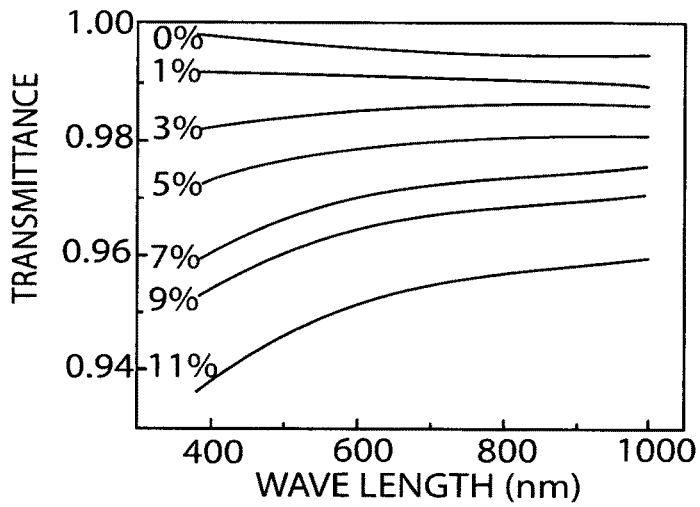
FIG. 5a is a plot transmittance of the hydrazine-reduced and cured composite films versus the wavelength.
Figure 5B:
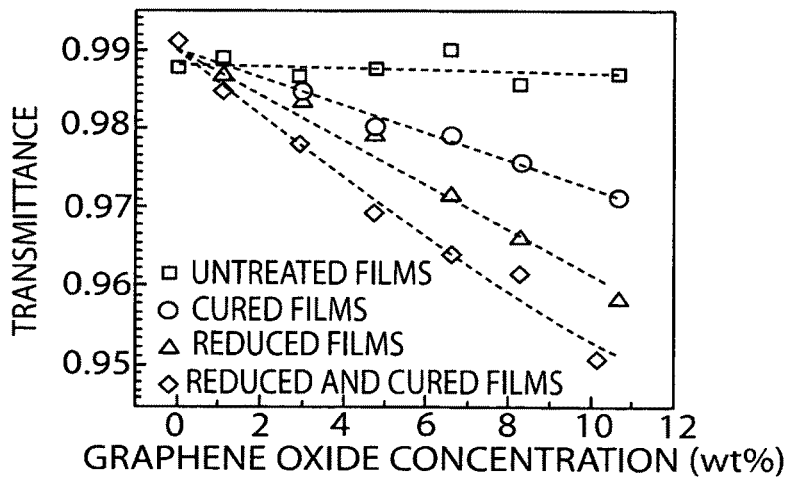
FIG. 5b is a plot 500-nm transmittance of composite films that have been subjected to different treatment procedures versus the graphene oxide concentration.

FIG. 5a plots transmittance of the hydrazine-reduced and cured composite films versus the wavelength and FIG. 5b plots 500-nm transmittance of composite films that have been subjected to different treatment procedures versus the graphene oxide sheet concentration. With respect to film transparency, incorporation of the light-yellow opaque graphite oxide dispersion into the silica matrix is accompanied by a decrease in their transparency that is proportional to the weight percent of the filler. In comparison, the pure silica films behave similarly to glass and are essentially highly transparent over the 380-1000 nm wavelength range (FIG. 5a). However, even at the highest loading (11 wt % graphene oxide), the transmittance is consistently high, ranging from 0.94 to 0.96 in the wavelength range of 380-1000 nm. The transparency of the graphene oxide-silica composite is further reduced after chemical reduction and high temperature curing (FIG. 5b) primarily due to the "graphenization" of the nanofiller and the transparency at 650 nm only drops by 5% after chemical reduction and curing. The electrical conductivity of the composite films is comparable to that of carbon nanotube-containing thin films reported in the literature; see Xiang, C. S.; Pan, Y. B.; Liu, X. J.; Shi, X. M.; Sun, X. W.; Guo, J. K. J. Nanosci. Nanotechnol. 2006, 6, 1-7.

Although the invention has been described in detail above with respect to certain embodiments, the invention is not limited to such embodiments since changes, modifications and omissions can be made thereto within the scope of the invention as defined in the appended claims.

The invention claimed is:

1. A method of making a solid, electrically conductive composite film or layer, comprising:
   making a suspension comprising individual insulating graphene oxide sheets;
   introducing particles of a ceramic or a ceramic-precursor to the suspension to form a sol;
   depositing the sol on a substrate to form a thin film or layer of a gel-like matrix;
   chemically reducing the thin film or layer to convert at least a portion of the individual insulating graphene oxide sheets to electrically conductive graphene-like sheets; and
   thermally consolidating the thin film or layer to form the solid, electrically conductive composite thin film or layer, wherein the solid, electrically conductive composite thin film or layer possesses an optical transparency of at least about 94 percent transmittance within a wavelength range from 380 nm to 1000 nm.

2. The method of claim 1, wherein the suspension is made by ultrasonically exfoliating graphite oxide sheet fragments in water.

3. The method of claim 1, wherein particles of a ceramic or a ceramic-precursor comprise particles of silica or a hydrolyzable silica precursor, respectively.

4. The method of claim 1, wherein depositing the sol on the substrate comprises spin coating the sol on the substrate.

5. The method of claim 1, wherein chemically reducing the thin film or layer comprises exposing the thin film or layer to an atmosphere of hydrazine hydrate.

6. The method of claim 1, wherein thermally consolidating the thin film or layer comprises exposing the thin film or layer to a temperature effective to form the solid, electrically conductive composite film or layer.

7. The method of claim 6, wherein the temperature is about 400 degrees C.

8. The method of claim 1, wherein the sol includes graphene oxide content from about 3 wt % to about 15 wt %.

9. The method of claim 1, wherein the sol includes graphene oxide content from 3.9 wt % to 11 wt %.

10. The method of claim 9, wherein the solid, electrically conductive thin film or layer possesses a conductivity from about $8.0\times10^{-4}$ S/cm to about 0.45 S/cm.

* * * * *